US012795963B2

(12) United States Patent
Liang et al.

(10) Patent No.: US 12,795,963 B2
(45) Date of Patent: Nov. 10, 2026

(54) SEMICONDUCTOR STRUCTURE

(71) Applicant: MediaTek Singapore Pte. Ltd., Singapore (SG)

(72) Inventors: Chang Liang, Singapore (SG); Zhigang Duan, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 607 days.

(21) Appl. No.: 18/320,432

(22) Filed: May 19, 2023

(65) Prior Publication Data

US 2023/0420492 A1 Dec. 28, 2023

Related U.S. Application Data

(60) Provisional application No. 63/354,358, filed on Jun. 22, 2022.

(51) Int. Cl.
*H10D 1/68* (2025.01)
*H10W 20/40* (2026.01)

(52) U.S. Cl.
CPC .......... *H10D 1/696* (2025.01); *H10W 20/496* (2026.01)

(58) Field of Classification Search
CPC ........ H10D 1/665; H10D 1/696; H10D 1/716; H10W 20/49; H10B 12/038; H10B 12/0387
See application file for complete search history.

(56) References Cited

U.S. PATENT DOCUMENTS

2004/0235245 A1 11/2004 Summerfelt
2013/0175666 A1 7/2013 Tran
2014/0159200 A1 6/2014 Loke
2015/0102459 A1 4/2015 Lai
2016/0104762 A1 4/2016 Triyoso
2017/0142838 A1 5/2017 Kurosawa
2018/0226340 A1 8/2018 Tu
2019/0348496 A1* 11/2019 Murase .................. H10D 1/042
2021/0091169 A1 3/2021 Lin
(Continued)

FOREIGN PATENT DOCUMENTS

DE 102008048651 B4 11/2010
DE 102018122563 A1 4/2019

OTHER PUBLICATIONS

Office Action dated Jan. 20, 2025, issued in application No. DE 10 2023 115 139.8.

*Primary Examiner* — Thanhha S Pham
(74) *Attorney, Agent, or Firm* — McClure, Qualey & Rodack, LLP

(57) ABSTRACT

A semiconductor structure includes a first semiconductor substrate, a plurality of first capacitor structures, a first dielectric layer, a second semiconductor substrate, a plurality of second capacitor structures, and a plurality of conductive pillars. The first capacitor structures are disposed in the first semiconductor substrate and arranged side-by-side. The first dielectric layer covers the first capacitor structures. The second semiconductor substrate is disposed over the first dielectric layer. The second capacitor structures are disposed in the second semiconductor substrate and arranged side-by-side. The conductive pillars extend in the first dielectric layer and electrically couple the first capacitor structures to the second capacitor structures.

20 Claims, 4 Drawing Sheets

(56) References Cited

U.S. PATENT DOCUMENTS

| | | | | |
|---|---|---|---|---|
| 2022/0028782 | A1* | 1/2022 | Hosogai | H10F 39/802 |
| 2022/0115358 | A1 | 4/2022 | Huang | |
| 2023/0024307 | A1* | 1/2023 | Lee | H10B 12/036 |

* cited by examiner

SEMICONDUCTOR STRUCTURE

CROSS REFERENCE TO RELATED APPLICATIONS

This application claims the benefit of U.S. Provisional Application No. 63/354,358 filed on Jun. 22, 2022, the entirety of which is incorporated by reference herein.

BACKGROUND OF THE INVENTION

Field of the Invention

The present invention is related to semiconductor technology, and in particular to a semiconductor structure including capacitor structures.

Description of the Related Art

Semiconductor structures are widely used in various electronic applications, such as personal computers, mobile phones, digital cameras, and other electronic equipment. As a result of the progress being made in the semiconductor industry, a smaller semiconductor structure that takes up less space than the previous generation of semiconductor structures is required.

In addition, as high-performance integrated circuits demand larger currents at higher frequencies with lower power-supply voltages, power system design becomes increasingly challenging. Decoupling capacitors may be adopted to act as temporary charge reservoirs to prevent momentary fluctuations in supply voltage. The decoupling capacitors are more and more important to reduce power noise.

However, although existing semiconductor structures generally meet requirements, they have not been satisfactory in every respect. For example, while the size of electronic components such as transistors and resistors is getting smaller, capacitor structures still need to take up more space than other electronic components owing to their physical properties. This is unfavorable for the miniaturization of semiconductor structures. Therefore, further improvements to semiconductor structures are required.

BRIEF SUMMARY OF THE INVENTION

Semiconductor structures are provided. An exemplary embodiment of a semiconductor structure includes a first semiconductor substrate, a plurality of first capacitor structures, a first dielectric layer, a second semiconductor substrate, a plurality of second capacitor structures, and a plurality of conductive pillars. The first capacitor structures are disposed in the first semiconductor substrate and arranged side-by-side. The first dielectric layer covers the first capacitor structures. The second semiconductor substrate is disposed over the first dielectric layer. The second capacitor structures are disposed in the second semiconductor substrate and arranged side-by-side. The conductive pillars extend in the first dielectric layer and electrically couple the first capacitor structures to the second capacitor structures.

Another exemplary embodiment of a semiconductor structure includes a first semiconductor substrate, a plurality of first capacitor structures, a first dielectric layer, a plurality of second capacitor structures, and a second semiconductor substrate. The first capacitor structures are disposed over the first semiconductor substrate and arranged side-by-side. The first dielectric layer surrounds the first capacitor structures. The second capacitor structures are disposed over the first capacitor structures and arranged side-by-side. The second capacitor structures are electrically coupled to the first capacitor structures. The second semiconductor substrate is disposed over the first dielectric layer.

Yet another exemplary embodiment of a semiconductor structure includes a first semiconductor substrate, a plurality of first capacitor structures, a plurality of second capacitor structures, a dielectric layer, and a second semiconductor substrate. The first capacitor structures are embedded in the first semiconductor substrate and arranged side-by-side. The second capacitor structures are disposed over the first capacitor structures and arranged side-by-side. The second capacitor structures are electrically coupled to the first capacitor structures. The dielectric layer covers the first capacitor structures. The second semiconductor substrate is disposed over the dielectric layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
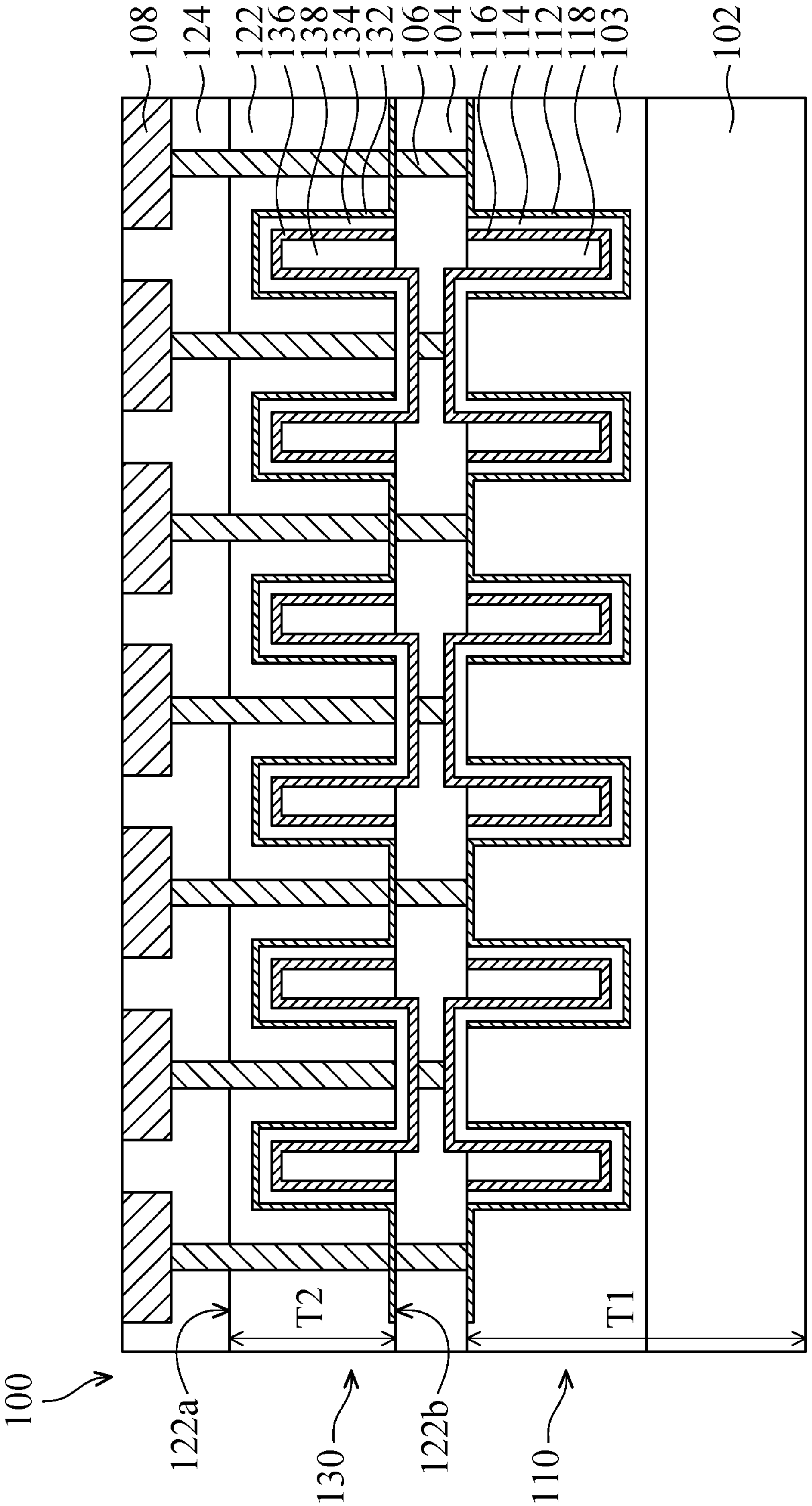
FIGS. 1-4 are cross-sectional views of exemplary semiconductor structures in accordance with some embodiments.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description of "a first element on/over a second element" may include embodiments in which the first element is in direct contact with the second element, and may also include embodiments in which additional elements are disposed between the first element and the second element such that the first element and the second element are not in direct contact.

Furthermore, the description of "a first element extending through a second element" may include embodiments in which the first element is disposed in the second element and extends from a side of the second element to an opposite side of the second element, wherein a surface of the first element may be substantially leveled with a surface of the second element, or a surface of the first element may be outside a surface of the second element.

The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A semiconductor structure including capacitor structures is described in accordance with some embodiments of the present disclosure. The semiconductor structure includes stacked substrates and capacitor structures disposed on and/or in each of the substrates to replace one substrate. As a result, the capacitance can be increased without taking up larger thickness.

FIG. 1 is a cross-sectional view of a semiconductor structure 100 in accordance with some embodiments of the present disclosure. Additional features can be added to the semiconductor structure 100. Some of the features described below can be replaced or eliminated for different embodiments. To simplify the diagram, only a portion of the semiconductor structure 100 is illustrated.

As shown in FIG. 1, the semiconductor structure 100 includes a first semiconductor substrate 102, in accordance with some embodiments. The first semiconductor substrate 102 may be formed of any suitable semiconductor material, such as silicon, germanium, silicon carbon, silicon germanium, gallium arsenide, indium arsenide, indium phosphide, the like, or a combination thereof. The first semiconductor substrate 102 may include a bulk semiconductor or a composite substrate formed of different materials. The first semiconductor substrate 102 may include a semiconductor-on-insulator (SOI) substrate formed by a semiconductor material on an insulating layer, such as a silicon-on-insulator substrate.

The first semiconductor substrate 102 may be doped (e.g., using p-type or n-type dopants) or undoped. Any desired semiconductor elements (including active elements and/or passive elements) may be formed in and on the first semiconductor substrate 102. However, in order to simplify the figures, only the flat first semiconductor substrate 102 is illustrated.

As illustrated in FIG. 1, the semiconductor structure 100 includes a doped region 103 formed in the first semiconductor substrate 102, in accordance with some embodiments. The doped region 103 may be a p-type doped region, and may include p-type dopants, such as boron. Alternatively, the doped region 103 may be an n-type doped region, and may include n-type dopants, such as phosphorus, arsenic, or a combination thereof. In some other embodiments, the first semiconductor substrate 102 has a first doping type (e.g., n-type), and the doped region 103 may have a second doping type (e.g., p-type) that is different from the first doping type.

As shown in FIG. 1, the semiconductor structure 100 includes a plurality of first capacitor structure 110 disposed in the first semiconductor substrate 102, in accordance with some embodiments. The first capacitor structures 110 may be arranged side-by-side and may be disposed in a row. The first capacitor structures 110 may extend from a top surface of the first semiconductor substrate 102 to an underlying location within the doped region 103. The bottom surface of the first capacitor structures 110 may be higher than the bottom surface of the doped region 103.

In some embodiments, the first capacitor structures 110 are deep trench capacitors which are formed in the trenches in the doped region 103. The trenches may be formed by one or more patterning processes, including photolithography processes, etching processes, any suitable processes, or a combination thereof. The bottom portions of the first capacitor structures 110 may have U shapes as shown in FIG. 1, V shapes, or any suitable shapes, depending on the shapes of the trenches.

As illustrated in FIG. 1, each of the first capacitor structures 110 includes a first electrode layer 112, a first interlayer dielectric layer 114, a second electrode layer 116, and a first filling material 118, in accordance with some embodiments. According to some embodiments, the first electrode layer 112, the first interlayer dielectric layer 114, and the second electrode layer 116 are formed conformally in the trenches in sequence, and then the first filling material 118 is formed in the remaining portion of the trenches.

The first electrode layer 112 and the second electrode layer 116 may each independently formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), doped polysilicon, the like, an alloy thereof, or a combination thereof. The first electrode layer 112 and the second electrode layer 116 may be formed of the same material or different materials. The first interlayer dielectric layer 114 may be formed of silicon oxide, silicon nitride, silicon oxynitride, high-k dielectric materials (e.g., $HfO_2$, $ZrO_2$, $La_2O_3$, $Al_2O_3$, $TiO_2$), the like, or a combination thereof. The first filling material 118 may be formed of semiconductor materials, including silicon or any suitable materials.

As shown in FIG. 1, the first electrode layer 112 may extend over a portion of the top surface of the first semiconductor substrate 102, and may connect adjacent trenches. The first interlayer dielectric layer 114 may extend over another portion of the top surface of the first semiconductor substrate 102, and may cover the top surface of the first electrode layer 112. The second electrode layer 116 may extend over the top surface of the first interlayer dielectric layer 114, and may connect adjacent trenches.

The first electrode layer 112 and the second electrode layer 116 may each connect adjacent trenches on opposite sides of the trenches. For example, the second electrode layer 116 may connect the first trench and the second trench, and the first electrode layer 112 may connect the second trench and the third trench, according to some embodiments. In these embodiments, the first electrode layer 112 in the first trench is separated from the first electrode layer 112 in the second trench, and the second electrode layer 116 in the second trench is separated from the second electrode layer 116 in the third trench.

It should be noted that the number of the electrode layers (such as the first electrode layer 112 and the second electrode layer 116) and the number of the interlayer dielectric layer (such as the first interlayer dielectric layer 114) shown in the figures are exemplary only and are not intended to limit the present disclosure. For example, the first capacitor structures 110 may include additional interlayer dielectric layers and additional electrode layers disposed between the second electrode layer 116 and the first filling material 118.

As illustrated in FIG. 1, the semiconductor structure 100 includes a first dielectric layer 104 disposed over the first semiconductor substrate 102, in accordance with some embodiments. The first dielectric layer 104 may be formed of dielectric materials, including silicon oxide, silicon nitride, silicon oxynitride, the like, or a combination thereof. The portions of the first interlayer dielectric layer 114 and the second electrode layer 116 over the top surface of the first semiconductor substrate 102 may be surrounded by the first dielectric layer 104. The sidewall of the first dielectric layer 104 may be substantially coplanar with the sidewall of the first semiconductor substrate 102.

As shown in FIG. 1, the semiconductor structure 100 includes a second semiconductor substrate 122 disposed over the first dielectric layer 104, in accordance with some embodiments. The sidewall of the second semiconductor substrate 122 may be substantially coplanar with the sidewall of the first interlayer dielectric layer 114.

The second semiconductor substrate 122 may be formed of any suitable semiconductor material, such as silicon, germanium, silicon carbon, silicon germanium, gallium arsenide, indium arsenide, indium phosphide, the like, or a combination thereof. The second semiconductor substrate 122 may include a bulk semiconductor or a composite substrate formed of different materials. The second semiconductor substrate 122 may include a semiconductor-on-insulator (SOI) substrate formed by a semiconductor material on an insulating layer, such as a silicon-on-insulator substrate. The material of the second semiconductor substrate 122 may be similar to or different from the material of the first semiconductor substrate 102.

The second semiconductor substrate 122 may be doped using p-type dopants (e.g., boron) or n-type dopants (e.g., phosphorus, arsenic, or a combination thereof). The doped region 103 in the first semiconductor substrate 102 may have a doping type similar to or different from the doping type of the doped region in the second semiconductor substrate 122. Any desired semiconductor elements (including active elements and/or passive elements) may be formed in and on the second semiconductor substrate 122. However, in order to simplify the figures, only the flat second semiconductor substrate 122 is illustrated.

According to some embodiments, the first semiconductor substrate 102 and the second semiconductor substrate 122 are thinned to reduce the total thickness of the semiconductor structure 100. The first semiconductor substrate 102 has a thickness of T1 measured from the top surface to the bottom surface of the first semiconductor substrate 102. In some embodiment, the thickness T1 is in a range of 40 μm to 750 μm, such as 55 μm. The second semiconductor substrate 122 has a thickness of T2 measured from the top surface 122*a* to the bottom surface 122*b* of the second semiconductor substrate 122. In some embodiment, the thickness T2 is in a range of 3 μm to 10 μm, such as 5 μm.

As shown in FIG. 1, the thickness T1 of the first semiconductor substrate 102 may be greater than the thickness T2 of the second semiconductor substrate 122. For example, a ratio of the thickness T2 of the second semiconductor substrate 122 to the thickness T1 of the first semiconductor substrate 102 may be in a range of 4 μm to 260 μm, such as 10 μm.

As shown in FIG. 1, the semiconductor structure 100 includes a plurality of second capacitor structure 130 disposed in the second semiconductor substrate 122, in accordance with some embodiments. The second capacitor structures 130 may be arranged side-by-side and may be disposed in a row. The second capacitor structures 130 may extend from the bottom surface 122*b* toward the top surface 122*a* of the second semiconductor substrate 122.

It should be noted that the number of the first capacitor structures 110 and the number of the second capacitor structures 130 shown in the figures are exemplary only and are not intended to limit the present disclosure. For example, the number of the first capacitor structures 110 may be different from the number of the second capacitor structures 130.

In some embodiments, the second capacitor structures 130 are deep trench capacitors which are formed in the trenches in the doped region of the second capacitor structures 130. The trenches may be formed by one or more patterning processes, including photolithography processes, etching processes, any suitable processes, or a combination thereof. The portions of the second capacitor structures 130 in the trenches may have U shapes as shown in FIG. 1, V shapes, or any suitable shapes, depending on the shapes of the trenches, and may be similar to or different from the shapes of the bottom portions of the first capacitor structures 110.

As illustrated in FIG. 1, each of the second capacitor structures 130 includes a third electrode layer 132, a second interlayer dielectric layer 134, a fourth electrode layer 136, and a second filling material 138, in accordance with some embodiments. According to some embodiments, the third electrode layer 132, the second interlayer dielectric layer 134, and the fourth electrode layer 136 are formed conformally in the trenches in sequence, and then the second filling material 138 is formed in the remaining portion of the trenches.

The materials of the third electrode layer 132, the second interlayer dielectric layer 134, the fourth electrode layer 136, and the second filling material 138 may include the materials of the first electrode layer 112, the first interlayer dielectric layer 114, the second electrode layer 116, and the first filling material 118, respectively, and will not be repeated. The materials of the second capacitor structures 130 may be similar to or different from the materials of the first capacitor structures 110.

The second capacitor structures 130 may be disposed opposite to the first capacitor structures 110. The portions of the second interlayer dielectric layer 134 and the fourth electrode layer 136 below the bottom surface 122*b* of the second semiconductor substrate 122 may be surrounded by the first dielectric layer 104.

As shown in FIG. 1, the third electrode layer 132 may extend below a portion of the bottom surface 122*b* of the second semiconductor substrate 122, and may connect adjacent trenches. The second interlayer dielectric layer 134 may extend below another portion of the bottom surface 122*b* of the second semiconductor substrate 122, and may cover the bottom surface 122*b* of the third electrode layer 132. The fourth electrode layer 136 may extend below the bottom surface 122*b* of the second interlayer dielectric layer 134, and may connect adjacent trenches.

The third electrode layer 132 and the fourth electrode layer 136 may each connect adjacent trenches on opposite sides of the trenches. For example, the fourth electrode layer 136 may connect the first trench and the second trench, and the third electrode layer 132 may connect the second trench and the third trench, according to some embodiments. In these embodiments, the third electrode layer 132 in the first trench is separated from the third electrode layer 132 in the second trench, and the fourth electrode layer 136 in the second trench is separated from the fourth electrode layer 136 in the third trench.

It should be noted that the number of the electrode layers (such as the third electrode layer 132 and the fourth electrode layer 136) and the number of the interlayer dielectric layer (such as the second interlayer dielectric layer 134) shown in the figures are exemplary only and are not intended to limit the present disclosure. For example, the second capacitor structures 130 may include additional interlayer dielectric layers and additional electrode layers disposed between the fourth electrode layer 136 and the second filling material 138.

As shown in FIG. 1, the semiconductor structure 100 includes a plurality of conductive pillars 106 disposed in the first dielectric layer 104 and the second semiconductor substrate 122, in accordance with some embodiments. The conductive pillars 106 may extend through the first dielectric layer 104 and the second semiconductor substrate 122 to a second dielectric layer 124.

The conductive pillars 106 may electrically couple the first capacitor structures 110 to the second capacitor structures 130 and to a conductive layer 108 over the second semiconductor substrate 122. In some embodiments, some of the conductive pillars 106 electrically couple the first electrode layer 112 to the third electrode layer 132, and some of the conductive pillars 106 electrically couple the second electrode layer 116 to the fourth electrode layer 136.

The conductive pillars 106 and the conductive layer 108 may each independently be formed of conductive material, including metal (e.g., tungsten, titanium, tantalum, ruthenium, cobalt, copper, aluminum, platinum, tin, silver, gold), metallic compound (e.g., tantalum nitride, titanium nitride, tungsten nitride), doped polysilicon, the like, an alloy thereof, or a combination thereof.

As shown in FIG. 1, the semiconductor structure 100 includes a second dielectric layer 124 disposed over the second semiconductor substrate 122, in accordance with some embodiments. The conductive layer 108 may be disposed in the second semiconductor substrate 122. The material of the second dielectric layer 124 may include the material of the first dielectric layer 104, and will not be repeated. The sidewall of the second dielectric layer 124 may be substantially coplanar with the sidewall of the second semiconductor substrate 122. In some embodiments, the second dielectric layer 124 is spaced apart from the second capacitor structure 130 by the top portion of the second semiconductor substrate 122.

According to the present disclosure, the semiconductor structure 100 includes more than one semiconductor substrates and a plurality of capacitor structures embedded in each of the semiconductor substrates. By thinning and stacking the semiconductor substrates, the capacitance can be increased without increasing the total thickness of the semiconductor structure 100.

Figure 2:
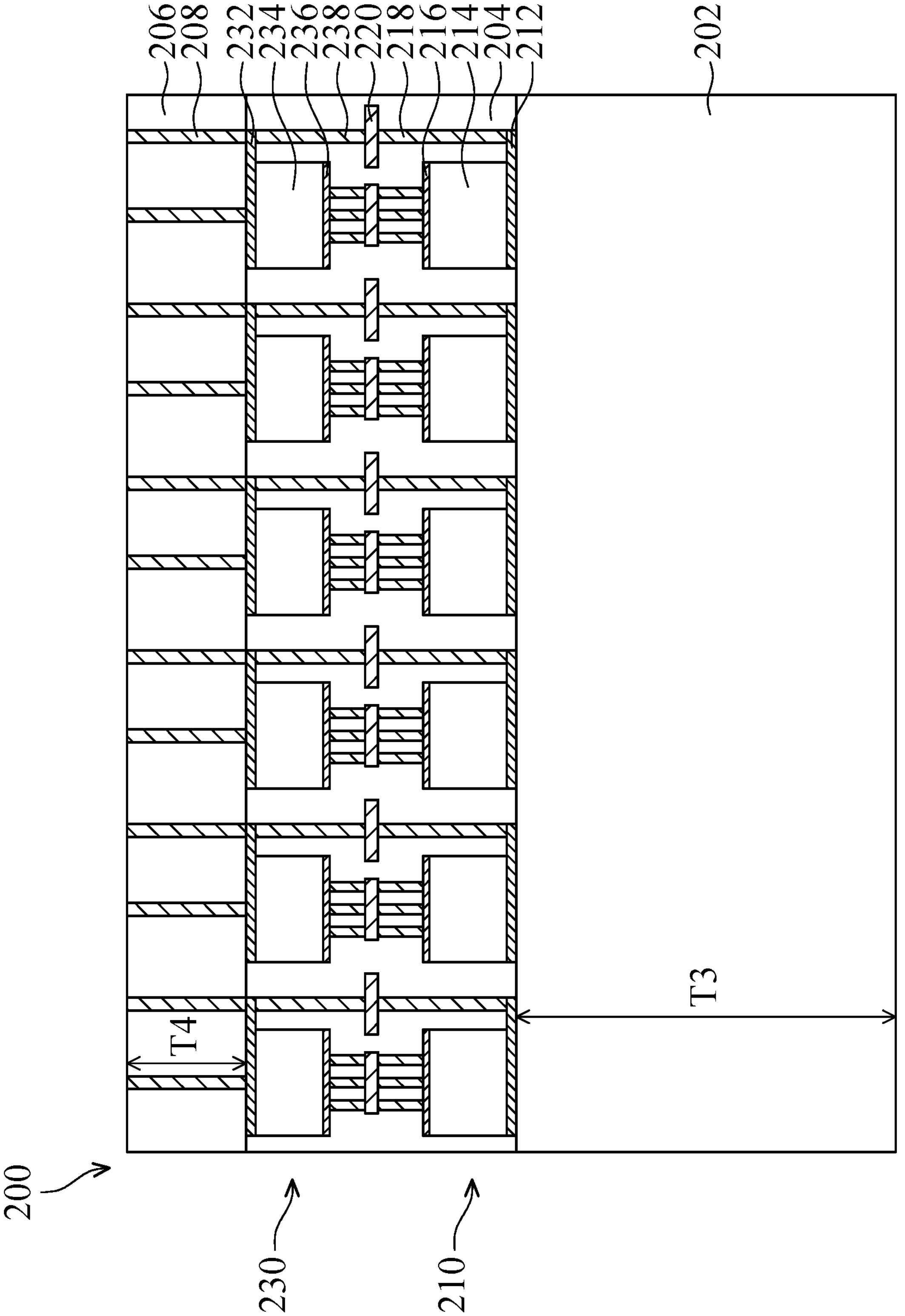

FIG. 2 is a cross-sectional view of a semiconductor structure 200, in accordance with some embodiments of the disclosure. It should be noted that the semiconductor structure 200 may include the same or similar components as that of the semiconductor structure 100, which is illustrated in FIG. 1, and for the sake of simplicity, those components will not be discussed in detail again. In the following embodiments, the semiconductor structure 200 includes a plurality of top-up type capacitor structures.

As shown in FIG. 2, the semiconductor structure 200 includes a first semiconductor substrate 202 and a second semiconductor substrate 206 stacked vertically, in accordance with some embodiments. The first semiconductor substrate 202 and the second semiconductor substrate 206 may be doped (e.g., using p-type or n-type dopants) or undoped. The first semiconductor substrate 202 and the second semiconductor substrate 206 may be similar to the first semiconductor substrate 102 and the second semiconductor substrate 124 as illustrated in FIG. 1, and will not be repeated.

According to some embodiments, the first semiconductor substrate 202 and the second semiconductor substrate 206 are thinned to reduce the total thickness of the semiconductor structure 200. The first semiconductor substrate 202 has a thickness of T3 measured from the top surface to the bottom surface of the first semiconductor substrate 202. In some embodiment, the thickness T3 is in a range of 35 μm to 745 μm, such as 35 μm. The second semiconductor substrate 206 has a thickness of T4 measured from the top surface to the bottom surface of the second semiconductor substrate 206. In some embodiment, the thickness T4 is in a range of 0.5 μm to 3 μm, such as 1.5 μm.

As shown in FIG. 2, the thickness T3 of the first semiconductor substrate 202 may be greater than the thickness T4 of the second semiconductor substrate 206. For example, a ratio of the thickness T4 of the second semiconductor substrate 206 to the thickness T3 of the first semiconductor substrate 202 may be in a range of 10 μm to 1000 μm, such as 26 μm.

As shown in FIG. 2, the semiconductor structure 200 includes a plurality of first capacitor structures 210 disposed over the first semiconductor substrate 202 and a plurality of second capacitor structures 230 disposed below the second semiconductor substrate 206, in accordance with some embodiments. The first capacitor structures 210 may be arranged side-by-side and may be disposed in a row, and the second capacitor structures 230 may be arranged side-by-side and may be disposed in a row over the first capacitor structures 210.

In some embodiments, each of the second capacitor structures 230 may be disposed corresponding to each of the first capacitor structures 210. It should be noted that the number of the first capacitor structures 210 and the number of the second capacitor structures 230 shown in the figures are exemplary only and are not intended to limit the present disclosure. For example, the number of the first capacitor structures 210 may be different from the number of the second capacitor structures 230.

The first capacitor structures 210 and the second capacitor structures 230 may include top-up type capacitor structures. Each of the first capacitor structures 210 may include a first electrode layer 212, first capacitor cells 214, and a second electrode layer 216. The first capacitor cells 214 may be disposed between the first electrode layer 212 and the second electrode layer 216. Each of the second capacitor structures 230 may include a third electrode layer 232, second capacitor cells 234, and a fourth electrode layer 236. The second capacitor cells 234 may be disposed between the third electrode layer 232 and the fourth electrode layer 236.

The first electrode layer 212, the second electrode layer 216, the third electrode layer 232, and the fourth electrode layer 236 may each independently be formed of conductive material, including metal (e.g., tungsten, titanium, tantalum, ruthenium, cobalt, copper, aluminum, platinum, tin, silver, gold), metallic compound (e.g., tantalum nitride, titanium nitride, tungsten nitride), doped polysilicon, the like, an alloy thereof, or a combination thereof.

As shown in FIG. 2, the semiconductor structure 200 includes a plurality of conductive pillars 218 and 238 and a conductive layer 220 disposed between the first capacitor structures 210 and the second capacitor structures 230 to electrically couple the first capacitor structures 210 to the second capacitor structures 230, in accordance with some embodiments. The conductive pillars 218 and 238 and the conductive layer 220 may be similar to the conductive pillars 106 and the conductive layer 108 as illustrated in FIG. 1, respectively, and will not be repeated.

As shown in FIG. 2, the semiconductor structure 200 includes a dielectric layer 204 disposed between the first semiconductor substrate 202 and the second semiconductor substrate 206, in accordance with some embodiments. The dielectric layer 204 may be formed of dielectric materials, including silicon oxide, silicon nitride, silicon oxynitride, the like, or a combination thereof.

The dielectric layer 204 may surround each of the first capacitor structures 210, each of the second capacitor structures 230, each of the conductive pillars 218 and 238, and the conductive layer 220. The sidewall of the dielectric layer 204 may be substantially coplanar with the sidewall of the first semiconductor substrate 202, and may be substantially coplanar with the sidewall of the second semiconductor substrate 206.

The semiconductor structure 200 also includes a plurality of conductive pillars 208 disposed in the second semiconductor substrate 206 and electrically couple to the second capacitor structures 230, in accordance with some embodiments. The conductive pillars 208 may be similar to the conductive pillars 106 as illustrated in FIG. 1, and will not be repeated.

According to the present disclosure, the semiconductor structure 200 includes more than one semiconductor substrates and a plurality of capacitor structures disposed on each of the semiconductor substrates. By thinning and stacking the semiconductor substrates, the capacitance can be increased without increasing the total thickness of the semiconductor structure 200.

Figure 3:
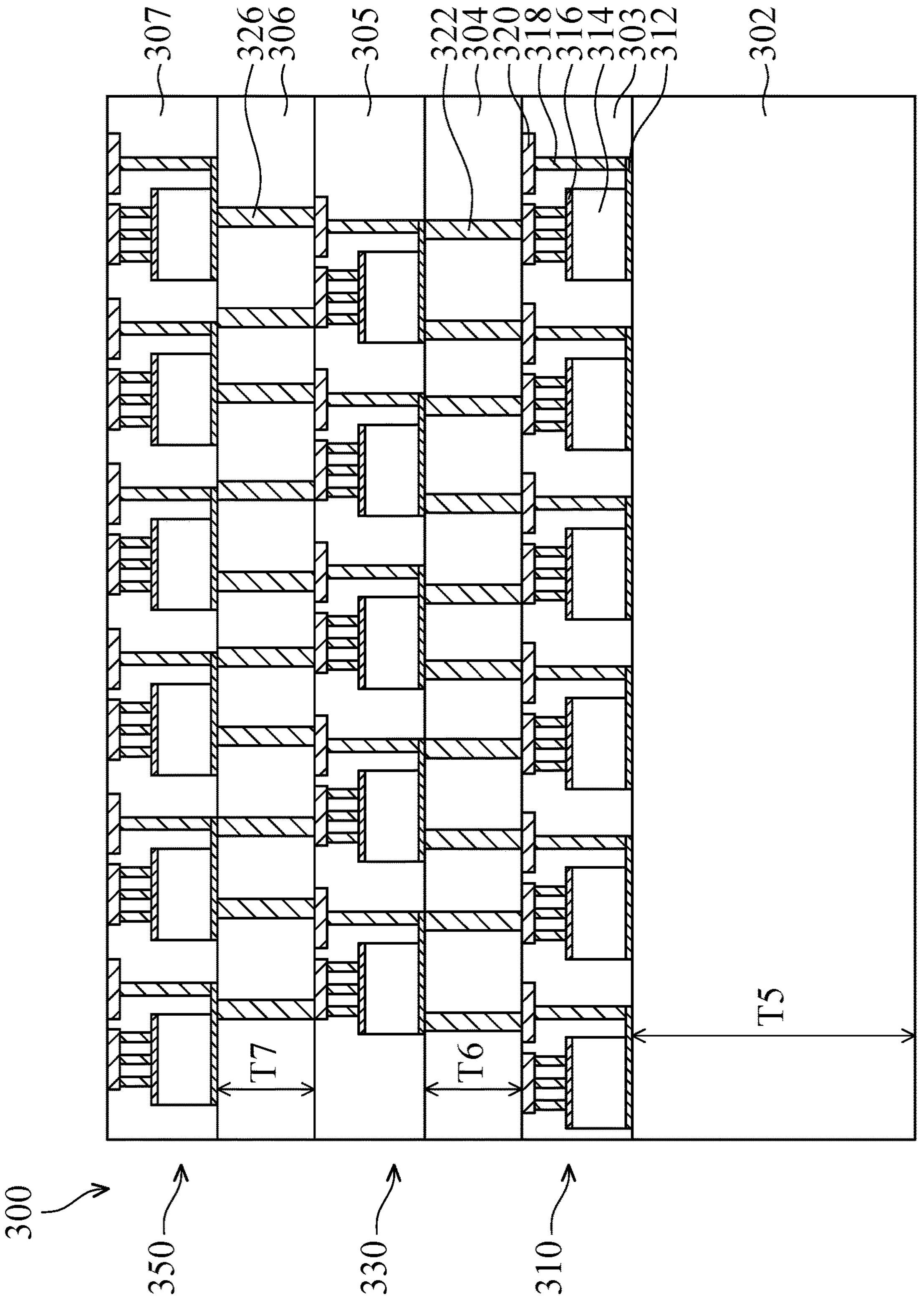

FIG. 3 is a cross-sectional view of a semiconductor structure 300, in accordance with some embodiments of the disclosure. It should be noted that the semiconductor structure 300 may include the same or similar components as that of the semiconductor structure 100, which is illustrated in FIG. 1, and for the sake of simplicity, those components will not be discussed in detail again. In the following embodiments, the semiconductor structure 300 includes a plurality of top-up type capacitor structures on opposite sides of the semiconductor substrate.

As shown in FIG. 3, the semiconductor structure 300 includes a first semiconductor substrate 302, a second semiconductor substrate 304, and a third semiconductor substrate 306 stacked vertically, in accordance with some embodiments. Each of the first semiconductor substrate 302, the second semiconductor substrate 304, and the third semiconductor substrate 306 may be doped (e.g., using p-type or n-type dopants) or undoped. The first semiconductor substrate 302, the second semiconductor substrate 304, and the third semiconductor substrate 306 may be similar to the first semiconductor substrate 102 and the second semiconductor substrate 124 as illustrated in FIG. 1, and will not be repeated.

According to some embodiments, the first semiconductor substrate 302, the second semiconductor substrate 304, and the third semiconductor substrate 306 are thinned to reduce the total thickness of the semiconductor structure 300. The first semiconductor substrate 302 has a thickness of T5 measured from the top surface to the bottom surface of the first semiconductor substrate 302. In some embodiment, the thickness T5 is in a range of 35 μm to 750 μm, such as 55 μm. The second semiconductor substrate 304 has a thickness of T6 measured from the top surface to the bottom surface of the second semiconductor substrate 304. In some embodiment, the thickness T6 is in a range of 0.5 μm to 3 μm, such as 1.5 μm. The third semiconductor substrate 306 has a thickness of T7 measured from the top surface to the bottom surface of the second semiconductor substrate 306. In some embodiment, the thickness T7 is in a range of 0.5 μm to 1 μm, such as 1.5 μm.

As shown in FIG. 3, the thickness T5 of the first semiconductor substrate 302 may be greater than the thickness T6 of the second semiconductor substrate 304 and greater than the thickness T7 of the third semiconductor substrate 306. For example, a ratio of the thickness T6 of the second semiconductor substrate 304 to the thickness T5 of the first semiconductor substrate 302 may be in a range of 10 μm to 1000 μm, such as 26 μm. For example, a ratio of the thickness T7 of the third semiconductor substrate 306 to the thickness T5 of the first semiconductor substrate 302 may be in a range of 10 μm to 1000 μm, such as 26 μm. The thickness T6 of the second semiconductor substrate 304 may be substantially equal to, greater than, or less than the thickness T7 of the third semiconductor substrate 306.

As shown in FIG. 3, the semiconductor structure 300 includes a plurality of first capacitor structures 310 disposed over the first semiconductor substrate 302, a plurality of second capacitor structures 330 disposed over the second semiconductor substrate 304, and a plurality of third capacitor structures 350 disposed over the third semiconductor substrate 306, in accordance with some embodiments. In other words, the first capacitor structures 310 and the second capacitor structures 330 may be disposed on opposite sides of the second semiconductor substrate 304, and the second capacitor structures 330 and the third capacitor structures 350 may be disposed on opposite sides of the third semiconductor substrate 306.

The first capacitor structures 310 may be arranged side-by-side and may be disposed in a row, the second capacitor structures 330 may be arranged side-by-side and may be disposed in a row over the first capacitor structures 310, and the third capacitor structures 350 may be arranged side-by-side and may be disposed in a row over the second capacitor structures 330.

It should be noted that the numbers of the first capacitor structures 310, the second capacitor structures 330, and the third capacitor structures 350 shown in the figures are exemplary only and are not intended to limit the present disclosure. For example, the number of the second capacitor structures 330 may be less than the number of the first capacitor structures 310 as shown in FIG. 3, or may be more than or equal to the number of the first capacitor structures 310.

The first capacitor structures 310, the second capacitor structures 330, and the third capacitor structures 350 may include top-up type capacitor structures. Each of the first capacitor structures 310, the second capacitor structures 330, and the third capacitor structures 350 may include a first electrode layer 312, capacitor cells 314, and a second electrode layer 316, and the capacitor cells 314 may be disposed between the first electrode layer 312 and the second electrode layer 316. The materials of first capacitor structures 310, the second capacitor structures 330, and the third capacitor structures 350 may include the materials of the first capacitor structures 210 and the second capacitor structures 230, and will not be repeated.

As shown in FIG. 3, the semiconductor structure 300 includes a plurality of conductive pillars 318 and a plurality of conductive layers 320 disposed over and electrically coupled to the first capacitor structures 310, the second capacitor structures 330, and the third capacitor structures 350, in accordance with some embodiments. The conductive pillars 318 and the conductive layers 320 may be similar to the conductive pillars 106 and the conductive layer 108 as illustrated in FIG. 1, respectively, and will not be repeated.

As shown in FIG. 3, the semiconductor structure 300 includes a first dielectric layer 303 disposed over the first semiconductor substrate 302, a second dielectric layer 305 disposed over the second semiconductor substrate 304, and a third dielectric layer 307 disposed over the third semiconductor substrate 306, in accordance with some embodiments. The first dielectric layer 303, the second dielectric layer 305, and the third dielectric layer 307 may each independently be formed of dielectric materials, including silicon oxide, silicon nitride, silicon oxynitride, the like, or a combination thereof.

As shown in FIG. 3, the sidewalls of the first dielectric layer 303, the second dielectric layer 305, and the third dielectric layer 307 may be substantially coplanar with the sidewalls of the first semiconductor substrate 302, the second semiconductor substrate 304, and the third semiconductor substrate 306. The first dielectric layer 303, the second dielectric layer 305, and the third dielectric layer 307 may surround each of the first capacitor structures 310, each of the second capacitor structures 330, each of the third capacitor structures 350, respectively, and may surround the conductive pillars 318 and the conductive layers 320.

The semiconductor structure 300 also includes a plurality of conductive pillars 322 disposed in the second semiconductor substrate 304 and electrically coupling the first capacitor structures 310 to the second capacitor structures 330, and a plurality of conductive pillars 326 disposed in the third semiconductor substrate 306 and electrically coupling the second capacitor structures 300 to the third capacitor structures 350, in accordance with some embodiments. The conductive pillars 322 and 326 may be similar to the conductive pillars 106 as illustrated in FIG. 1, and will not be repeated.

According to the present disclosure, the semiconductor structure 300 includes more than one semiconductor substrates and a plurality of capacitor structures disposed over each of the semiconductor substrates. By thinning and stacking the semiconductor substrates, the capacitance can be increased without increasing the total thickness of the semiconductor structure 300.

Figure 4:
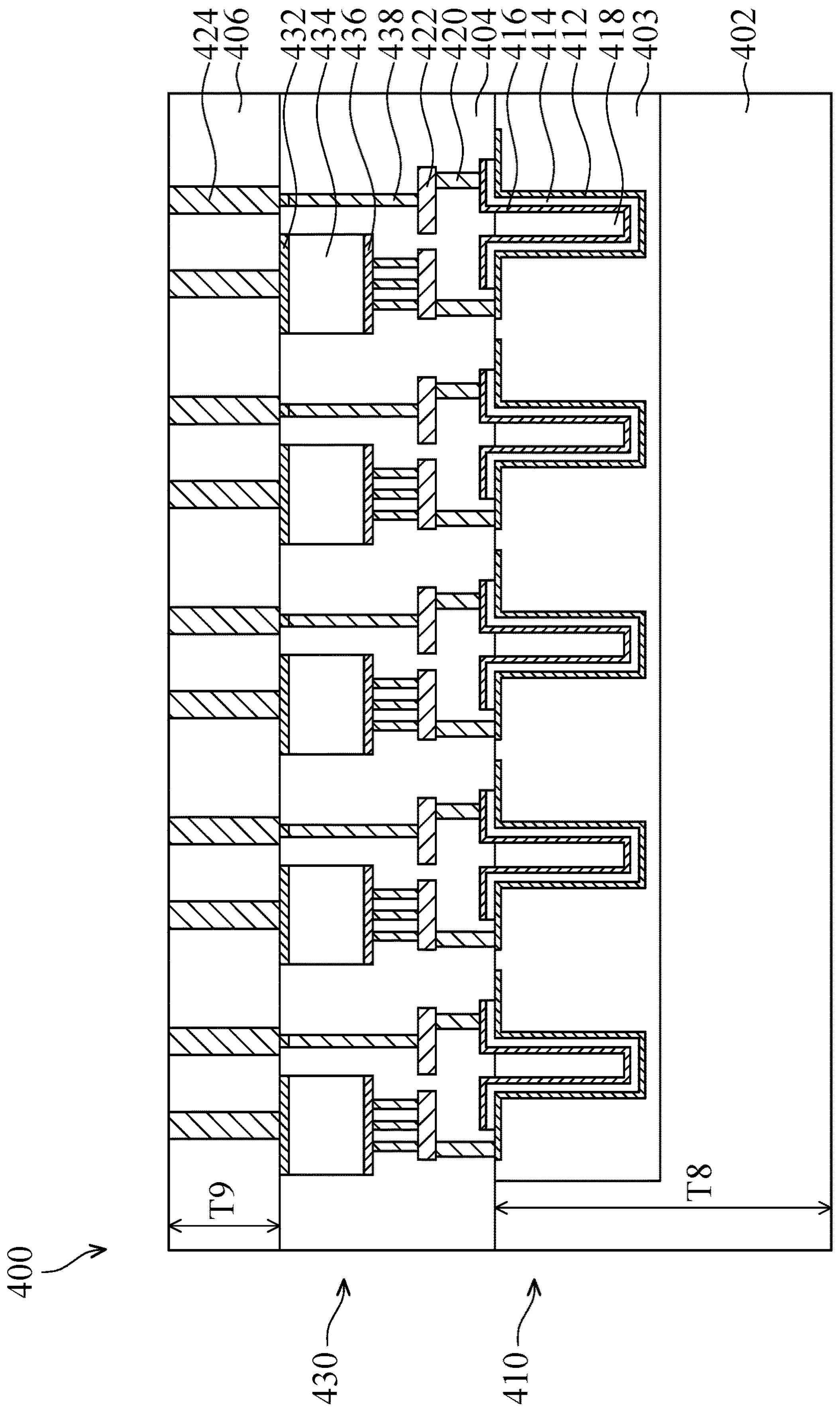

FIG. 4 is a cross-sectional view of a semiconductor structure 400, in accordance with some embodiments of the disclosure. It should be noted that the semiconductor structure 400 may include the same or similar components as that of the semiconductor structure 100, which is illustrated in FIG. 1, and for the sake of simplicity, those components will not be discussed in detail again. In the following embodiments, the semiconductor structure 400 includes a plurality of deep trench capacitors and a plurality of top-up type capacitor structures.

As shown in FIG. 4, the semiconductor structure 400 includes a first semiconductor substrate 402 and a second semiconductor substrate 406 stacked vertically, in accordance with some embodiments. The first semiconductor substrate 402 and the second semiconductor substrate 406 may be doped (e.g., using p-type or n-type dopants) or undoped. The first semiconductor substrate 402 and the second semiconductor substrate 406 may be similar to the first semiconductor substrate 102 and the second semiconductor substrate 124 as illustrated in FIG. 1, and will not be repeated.

According to some embodiments, the first semiconductor substrate 402 and the second semiconductor substrate 406 are thinned to reduce the total thickness of the semiconductor structure 400. The first semiconductor substrate 402 has a thickness of T8 measured from the top surface to the bottom surface of the first semiconductor substrate 402. In some embodiment, the thickness T8 is in a range of 35 μm to 750 μm, such as 55 μm. The second semiconductor substrate 406 has a thickness of T9 measured from the top surface to the bottom surface of the second semiconductor substrate 406. In some embodiment, the thickness T9 is in a range of 0.5 μm to 3 μm, such as 1.5 μm.

As shown in FIG. 4, the thickness T8 of the first semiconductor substrate 402 may be greater than the thickness T9 of the second semiconductor substrate 406. For example, a ratio of the thickness T9 of the second semiconductor substrate 406 to the thickness T8 of the first semiconductor substrate 402 may be in a range of 10 μm to 1000 μm, such as 26 μm.

As illustrated in FIG. 4, the semiconductor structure 400 includes a doped region 403 formed in the first semiconductor substrate 402, in accordance with some embodiments. The doped region 403 may be a p-type doped region, and may include p-type dopants, such as boron. Alternatively, the doped region 403 may be an n-type doped region, and may include n-type dopants, such as phosphorus, arsenic, or a combination thereof. In some other embodiments, the first semiconductor substrate 402 has a first doping type (e.g., n-type), and the doped region 403 may have a second doping type (e.g., p-type), which is different than the first doping type.

As shown in FIG. 4, the semiconductor structure 400 includes a plurality of first capacitor structure 410 disposed in the first semiconductor substrate 402, in accordance with some embodiments. The first capacitor structures 410 may be arranged side-by-side and may be disposed in a row. The first capacitor structures 410 may extend from a top surface of the first semiconductor substrate 402 to an underlying location within the doped region 403. The bottom surface of the first capacitor structures 410 may be higher than the bottom surface of the doped region 403.

In some embodiments, the first capacitor structures 410 are deep trench capacitors which are formed in the trenches in the doped region 403. The trenches may be formed by one or more patterning processes, including photolithography processes, etching processes, any suitable processes, or a combination thereof. The bottom portions of the first capacitor structures 410 may have U shapes as shown in FIG. 4, V shapes, or any suitable shapes, depending on the shapes of the trenches.

As illustrated in FIG. 4, each of the first capacitor structures 410 includes a first electrode layer 412, an interlayer dielectric layer 414, a second electrode layer 416, and a filling material 418, in accordance with some embodiments. According to some embodiments, the first electrode layer 412, the interlayer dielectric layer 414, and the second electrode layer 416 are formed conformally in the trenches in sequence, and then the filling material 418 is formed in the remaining portion of the trenches. The materials of the first capacitor structures 410 may include the materials of first capacitor structures 110 as illustrated in FIG. 1, respectively, and will not be repeated.

As shown in FIG. 4, the first electrode layer 412 may extend over the top surface of the first semiconductor substrate 402. The interlayer dielectric layer 414 may extend over a portion of the top surface of the first electrode layer 412, and end portions of the first electrode layer 412 may be exposed. The second electrode layer 416 may extend over the top surface of the interlayer dielectric layer 414.

In some embodiments, the sidewall of the second electrode layer 416 is substantially coplanar with the sidewall of the interlayer dielectric layer 414. The sidewall of the first electrode layer 412 may extend beyond the sidewall of the interlayer dielectric layer 414 and the sidewall of the second electrode layer 416.

It should be noted that the number of the electrode layers (such as the first electrode layer 412 and the second electrode layer 416) and the number of the interlayer dielectric layer (such as the interlayer dielectric layer 414) shown in the figures are exemplary only and are not intended to limit the present disclosure. For example, the first capacitor structures 410 may include additional interlayer dielectric layers and additional electrode layers disposed between the second electrode layer 416 and the filling material 418.

As shown in FIG. 4, the semiconductor structure 400 includes a plurality of second capacitor structures 430 disposed below the second semiconductor substrate 406, in accordance with some embodiments. The second capacitor structures 430 may be arranged side-by-side and may be disposed in a row over the first capacitor structures 410.

As shown in FIG. 4, each of the second capacitor structures 430 may be disposed corresponding to each of the first capacitor structures 410. It should be noted that the numbers of the first capacitor structures 410 and the second capacitor structures 430 shown in the figures are exemplary only and are not intended to limit the present disclosure. For example, the number of the first capacitor structures 410 may be different from the number of the second capacitor structures 430.

The second capacitor structures 430 may include top-up type capacitor structures. Each of the second capacitor structures 430 may include a third electrode layer 432, capacitor cells 434, and a fourth electrode layer 436, and the capacitor cells 434 may be disposed between the third electrode layer 432 and the fourth electrode layer 436. The materials of the second capacitor structures 430 may include the materials of the first capacitor structures 210 as illustrated in FIG. 2, and will not be repeated.

As shown in FIG. 4, the semiconductor structure 400 includes a plurality of conductive pillars 420 and 438 and a conductive layer 422 disposed between the first capacitor structures 410 and the second capacitor structures 430 to electrically couple the first capacitor structures 410 to the second capacitor structures 430, in accordance with some embodiments. The conductive pillars 420 and 438 and the conductive layer 422 may be similar to the conductive pillars 106 and the conductive layer 108 as illustrated in FIG. 1, respectively, and will not be repeated.

As shown in FIG. 4, the semiconductor structure 400 includes a dielectric layer 404 disposed between the first semiconductor substrate 402 and the second semiconductor substrate 406, in accordance with some embodiments. The dielectric layer 404 may be formed of dielectric materials, including silicon oxide, silicon nitride, silicon oxynitride, the like, or a combination thereof.

The dielectric layer 404 may surround each of the first capacitor structures 410, each of the second capacitor structures 430, the conductive pillars 420 and 438, and the conductive layer 422. The sidewall of the dielectric layer 404 may be substantially coplanar with the sidewall of the first semiconductor substrate 402, and may be substantially coplanar with the sidewall of the second semiconductor substrate 406.

The semiconductor structure 400 also includes a plurality of conductive pillars 424 disposed in the second semiconductor substrate 406 and electrically couple to the second capacitor structures 430, in accordance with some embodiments. The conductive pillars 424 may be similar to the conductive pillars 106 as illustrated in FIG. 1, and will not be repeated.

According to the present disclosure, the semiconductor structure 400 includes more than one semiconductor substrates and a plurality of capacitor structures disposed in and over the semiconductor substrates. By thinning and stacking the semiconductor substrates, the capacitance can be increased without increasing the total thickness of the semiconductor structure 400.

In summary, the semiconductor structure according to the present disclosure includes substrates and rows of capacitor structures which are stacked vertically. The rows of capacitor structures are disposed on and/or in each of the substrates. In comparison to a semiconductor structure which has one thick substrate, the semiconductor structure according to the present disclosure has an increased capacitance without taking up larger thickness.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
- a first semiconductor substrate;
- a plurality of first capacitor structures disposed in the first semiconductor substrate and arranged side-by-side;
- a first dielectric layer covering the plurality of first capacitor structures;
- a second semiconductor substrate disposed over the first dielectric layer;
- a plurality of second capacitor structures disposed in the second semiconductor substrate and arranged side-by-side; and
- a plurality of conductive pillars extending in the first dielectric layer and electrically coupling the plurality of first capacitor structures to the plurality of second capacitor structures.

2. The semiconductor structure as claimed in claim 1, further comprising:
- a second dielectric layer disposed over the second semiconductor substrate; and
- a conductive layer disposed in the second dielectric layer and electrically coupled to the plurality of second capacitor structures.

3. The semiconductor structure as claimed in claim 1, wherein the plurality of first capacitor structures and the plurality of second capacitor structures are in contact with the first dielectric layer, and wherein the plurality of first capacitor structures is spaced apart from the second dielectric layer.

4. The semiconductor structure as claimed in claim 1, wherein the plurality of first capacitor structures and the plurality of second capacitor structures comprise deep trench capacitors.

5. The semiconductor structure as claimed in claim 1, wherein each of the first capacitor structures comprises:
- a first electrode layer;
- an interlayer dielectric layer disposed over the first electrode layer and covering a top surface of the first electrode layer; and
- a second electrode layer disposed over the interlayer dielectric layer and covering a top surface of the interlayer dielectric layer.

6. The semiconductor structure as claimed in claim 5, wherein the interlayer dielectric layer and the second electrode layer extend into the first dielectric layer.

7. The semiconductor structure as claimed in claim 1, wherein a thickness of the first semiconductor substrate is greater than a thickness of the second semiconductor substrate.

8. The semiconductor structure as claimed in claim 1, wherein a sidewall of the first dielectric layer is substantially coplanar with a sidewall of the first semiconductor substrate and a sidewall of the second semiconductor substrate.

9. The semiconductor structure as claimed in claim 1, wherein a thickness of the first semiconductor substrate is greater than a thickness of the second semiconductor substrate.

10. A semiconductor structure, comprising:
a first semiconductor substrate;
a first dielectric layer disposed over the first semiconductor substrate;
a second semiconductor substrate disposed over the first dielectric layer;
a plurality of first capacitor structures arranged side-by-side, wherein each of the first capacitor structures comprises a top electrode layer extending in the first dielectric layer; and
a plurality of second capacitor structures disposed over the plurality of first capacitor structures and arranged side-by-side; and
a plurality of first conductive pillars extending in the first dielectric layer and electrically coupling the plurality of first capacitor structures to the plurality of second capacitor structures.

11. The semiconductor structure as claimed in claim 10, wherein the plurality of first capacitor structures is disposed in the first semiconductor substrate and the plurality of second capacitor structures is disposed in the second semiconductor substrate.

12. The semiconductor structure as claimed in claim 10, further comprising:
a second dielectric layer separated from the first dielectric layer by the second semiconductor substrate,
wherein the plurality of first capacitor structures is disposed in the first dielectric layer and the plurality of second capacitor structures is disposed in the second dielectric layer.

13. The semiconductor structure as claimed in claim 10, further comprising a plurality of second conductive pillars extending through the second semiconductor substrate and electrically coupling the plurality of first capacitor structures to the plurality of second capacitor structures.

14. The semiconductor structure as claimed in claim 10, wherein the plurality of first capacitor structures comprise deep trench capacitors disposed in a doped region of the first semiconductor substrate.

15. The semiconductor structure as claimed in claim 10, wherein each of the first capacitor structures further comprises:

a bottom electrode layer disposed below the top electrode layer; and
capacitor cells disposed between the top electrode layer and the bottom electrode layer.

16. The semiconductor structure as claimed in claim 10, wherein each of the second capacitor structures further comprises:
a bottom electrode layer extending in the first dielectric layer;
a top electrode layer disposed above the bottom electrode layer; and
capacitor cells disposed between the bottom electrode layer and the top electrode layer.

17. The semiconductor structure as claimed in claim 10, wherein the plurality of first capacitor structures and the plurality of second capacitor structures are disposed in the first dielectric layer.

18. The semiconductor structure as claimed in claim 10, wherein the plurality of first capacitor structures is disposed in the first semiconductor substrate and the plurality of second capacitor structures is disposed in the first dielectric layer.

19. The semiconductor structure as claimed in claim 10, further comprising:
a second dielectric layer disposed over the second semiconductor substrate;
a third semiconductor substrate disposed over the second dielectric layer;
a third dielectric layer disposed over the second semiconductor substrate; and
a plurality of third capacitor structures disposed over the plurality of second capacitor structures and arranged side-by-side,
wherein the plurality of first capacitor structures is disposed in the first dielectric layer, the plurality of second capacitor structures is disposed in the second dielectric layer, and the plurality of third capacitor structures is disposed in the third dielectric layer.

20. The semiconductor structure as claimed in claim 19, further comprising:
a plurality of second conductive pillars extending through the second semiconductor substrate; and
a plurality of third conductive pillars extending through the third semiconductor substrate,
wherein the plurality of third conductive pillars is electrically coupled to the plurality of first capacitor structures and the plurality of second capacitor structures through the plurality of second conductive pillars.

* * * * *